United States Patent
Darwish et al.

(10) Patent No.: US 7,082,487 B2
(45) Date of Patent: Jul. 25, 2006

(54) MULTIPLE CONFIGURABLE I/O COMMON MEZZANINE CARDS

(75) Inventors: Mohammad Darwish, Vancouver (CA); Leonard G. Pucker, Columbia, MD (US); Phillip D. Smith, Burnaby (CA); Roy Gee Leong Woo, Vancouver (CA)

(73) Assignee: Spectrum Signal Processing, Inc., Burnaby (CA)

( * ) Notice: Subject to any disclaimer, the term of this patent is extended or adjusted under 35 U.S.C. 154(b) by 320 days.

(21) Appl. No.: 10/077,802

(22) Filed: Feb. 20, 2002

(65) Prior Publication Data

US 2003/0158989 A1   Aug. 21, 2003

(51) Int. Cl.
 *G06F 13/00* (2006.01)
(52) U.S. Cl. ..................................... 710/301
(58) Field of Classification Search ................. 710/301
See application file for complete search history.

(56) References Cited

U.S. PATENT DOCUMENTS

| | | | |
|---|---|---|---|
| 5,583,749 A * | 12/1996 | Tredennick et al. ........ 361/790 |
| 5,604,888 A | 2/1997 | Kiani-Shabestari | |
| 5,611,057 A | 3/1997 | Pecone | |
| 5,628,637 A | 5/1997 | Pecone | |
| 5,887,145 A * | 3/1999 | Harari et al. ................ 710/301 |
| 6,086,427 A | 7/2000 | Cahaly | |
| 6,308,234 B1* | 10/2001 | Davies et al. ............... 710/104 |
| 6,353,870 B1* | 3/2002 | Mills et al. .................. 710/301 |
| 6,527,562 B1* | 3/2003 | Tanaka et al. ................ 439/65 |
| 6,618,781 B1* | 9/2003 | Liauw et al. ................ 710/301 |
| 2002/0059492 A1* | 5/2002 | Sabotta et al. .............. 710/301 |
| 2003/0105609 A1* | 6/2003 | Conway et al. ............. 702/124 |

OTHER PUBLICATIONS

IEEE P1386 (CMC).

* cited by examiner

*Primary Examiner*—Rehana Perveen
*Assistant Examiner*—Nimesh Patel

(57) ABSTRACT

CMC boards have standardized dimensions for an "I/O envelope" (to accommodate components for I/O functions) and a "component envelope" (to accommodate components for core board functions). Daughter cards are developed (mainly to perform I/O functions but also to perform core board functions, if desired) that fit within the standardized dimensions of the I/O envelope.

2 Claims, 2 Drawing Sheets

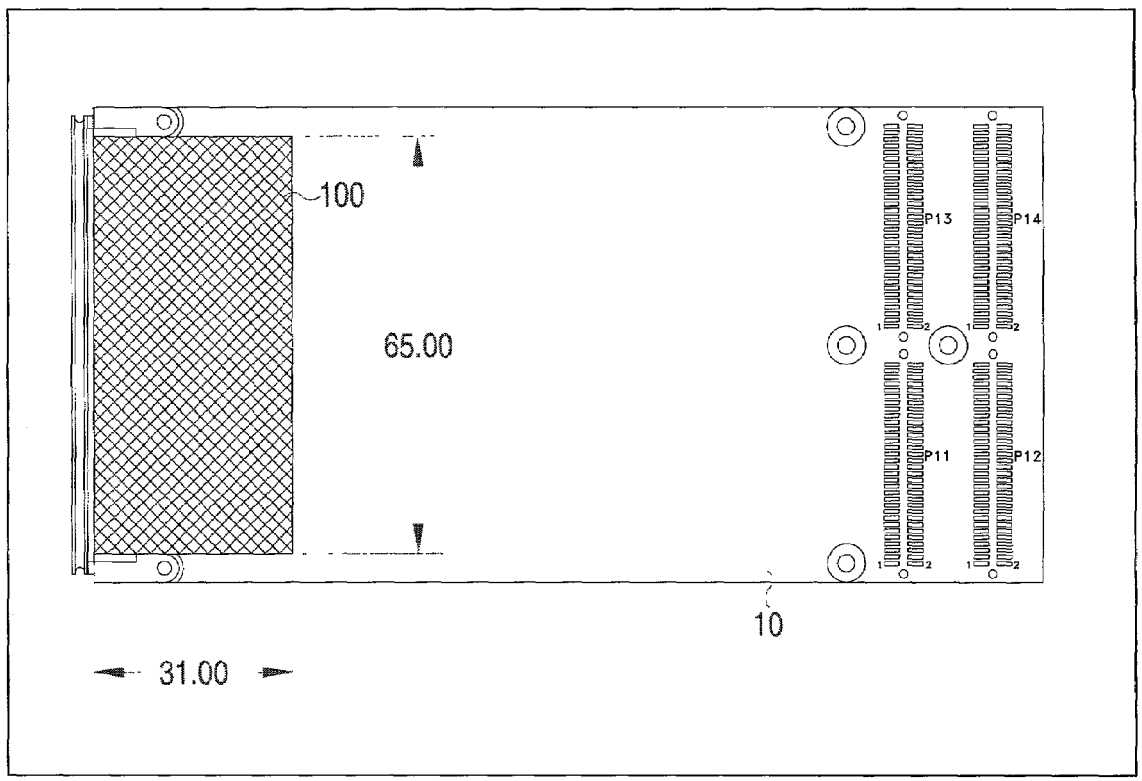
Figure 1 – CMC I/O Area
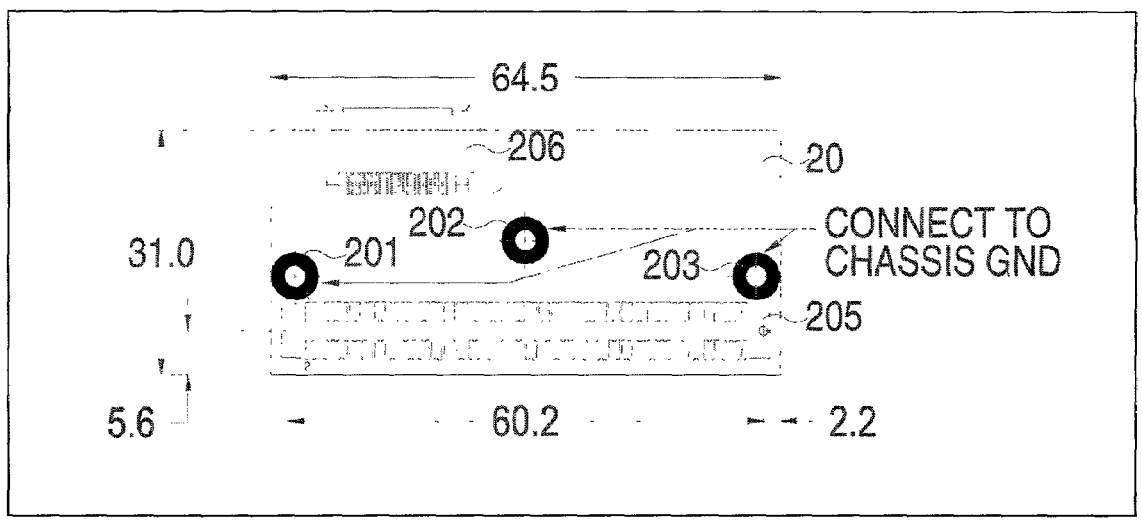
Figure 2 – I/O Daughter Card Side 2

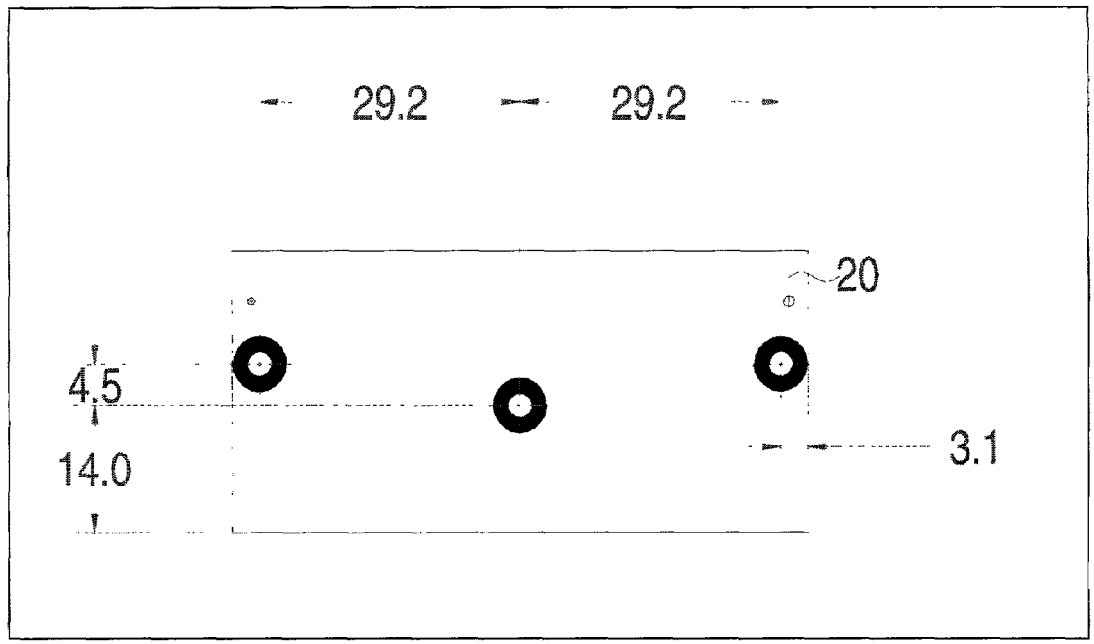
Figure 3 – I/O Daughter Card Side 2
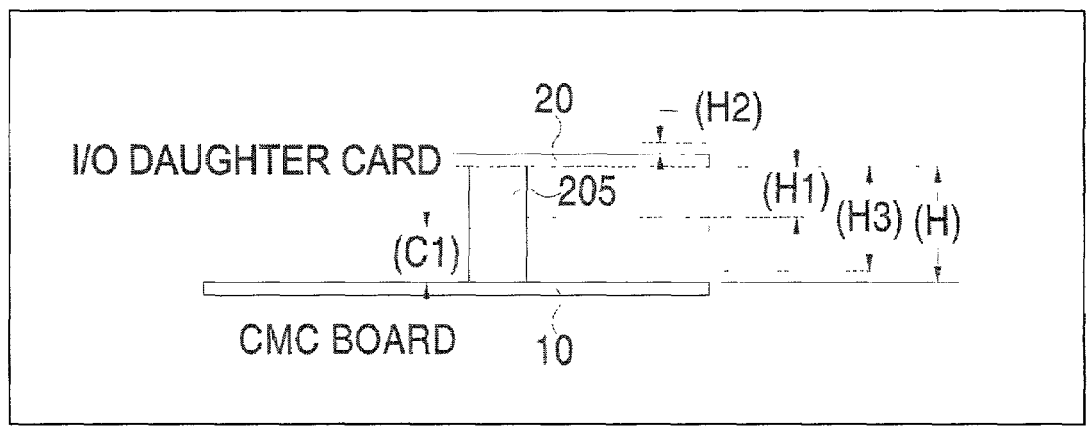
Figure 4 – Component Height Profile

MULTIPLE CONFIGURABLE I/O COMMON MEZZANINE CARDS

FIELD OF THE INVENTION

This invention relates to configurable I/O or other functions, on industry standard boards.

BACKGROUND OF THE INVENTION

The Common Mezzanine Card (CMC) standard (as described in IEEE standard P1386, as amended from to time) describes, among other things, the mechanics or form factor of a mezzanine card family that can be used interchangeably on a variety of host computer boards. These mezzanine cards can be used to provide modular I/O and/or general function expansion.

The mezzanine card's local bus can be based on the Peripheral Component Interconnect (PCI) specification or other specifications as developed in the future. PCI is a high speed local bus used by a variety of microprocessors. The PCI specification calls for a board that plugs into a carrier in a perpendicular fashion. Perpendicular boards are not usable for low profile computing applications, so the CMC standard defines a slim, modular, parallel mezzanine card, where I/O can be done via the front bezel and/or through connectors to the host computer.

For the purpose of this specification and for maximum clarity of terminology throughout this specification, the CMC card will be called the "CMC board" and the present invention's "daughter card" will be called as such.

The CMC board envelope space defines a space that may be occupied by the PCB, associated electronic components, and required cooling gap. The total CMC board envelope space is divided into two parts, the component envelope and the I/O envelope. The component envelope's maximum height is 8.2 mm. The I/O envelope's maximum height is 13.5 mm. The maximum depth of the I/O envelope is 31.0 mm. Within such standardized envelope dimension, the designer must work within good design constraints (such as stacking heights) for realistic performance, i.e. the real usable space is less than the standard envelope dimensions.

The component envelope is where electronic components for board core functions, are normally placed. No component is allowed to protrude through this envelope, except the CMC connectors, standoffs and bezel retention screws.

The I/O envelope is normally used for mounting I/O connectors on the CMC bezel. No component is allowed to protrude outside the I/O envelope (with the exception of the CMC bezel and I/O connectors mounted on the bezel, which protrude beyond the face of the bezel).

Conventionally, mezzanine cards based on the CMC standard have had a fixed core function and a fixed I/O capability. Examples of board core functions include: digital up-converters, digital down-converters, analog/digital converters, digital/analog converters, echo cancellers. Examples of I/O capabilities include: LVDS (Low Voltage Differential Signal), ECL (emitter-coupled logic) to TTL (transistor-transistor logic), differential ECL to TTL, SCSI, fibre optic's FPDP. In some applications, it is desirable to use a CMC board for its core functionality but require a solution that incorporates different I/O capabilities. One solution has been to produce the same basic CMC board but with different I/O functionality on the front panel. Another solution has been to route the I/O through the connectors to the host computer and use a separate standalone I/O adapter.

SUMMARY OF THE INVENTION

According to one aspect of the invention, there is provided a configurable computer board system attachable to a host computer bus, comprising: (a) a computer board having removable electrical connections between said computer board and the host computer bus; and (b) a daughter card with desired characteristics, having (i) removable electrical connections between said computer board and said daughter card, and (ii) removable electrical connections between said daughter board and another device of the host computer; wherein the core functions and I/O functions of said computer board are configurable according to the characteristics of said daughter card.

According to another aspect of the invention, there is provided a method of modularizing a computer board for a host computer comprising the steps of: (a) separating in the computer board, the core processing functions from the I/O functions; (b) implementing said core processing functions on the computer board; and (d) increasing the amount of physical space to implement said I/O functions; wherein said computer board conforms to industry standards in respect of form factor.

BRIEF DESCRIPTION OF THE DRAWINGS

A better understanding of the present invention can be obtained when the following detailed description of the preferred embodiment is considered in conjunction with the following drawings, in which:

FIG. 1 illustrates the I/O area of the CMC board;

FIG. 2 illustrates the layout of the daughter card that faces the CMC board I/O area;

FIG. 3 illustrates the layout of the opposite side of the daughter card layout of FIG. 2;

FIG. 4 illustrates suggested height clearances.

DETAILED DESCRIPTION OF THE PREFERRED EMBODIMENT

The CMC board's core functions can be implemented conventionally by FPGAs, ASICs, and the like.

Conventionally, the I/O and core functions of the CMC board had to be integrally designed and manufactured, so that if the I/O function had to be changed (for example, instead of translating from ECL to TTL, a LVDS technology was required), the entire CMC board had to be redesigned and manufactured.

A novel approach according to the present invention is to provide a configurable I/O solution by the use of a daughter I/O card that fits with the form factor of the I/O envelope of the CMC board. The essence of the novel approach is to increase the "real estate" of physical space to implement I/O functions by inserting daughter cards dimensioned appropriately to fit the I/O envelope of the CMC standard.

The daughter I/O card contains all the circuitry required for a specific I/O solution. It has an I/O connector that contains all the signals and power connections necessary to operate the I/O circuitry. The CMC board would be designed in a manner that allows for a clean separation between core functionality of the CMC board and the external operations, such as I/O. Thus to choose a different I/O solution, the user (or the manufacturer) need only change the daughter I/O card on the CMC board.

Furthermore, in some applications, no I/O connectors are contemplated (i.e. no connectors to external devices but only connections to the host computer bus or similar communications mechanism to which the CMC board is connected). In other words, the CMC board has no "front panel". In such applications, the present invention also increases the "real estate" of physical space for implementing in the space of the CMC I/O envelope, supplemental functions to augment the core processing functions normally accomplished solely by technology in the CMC component envelope.

A main advantage of the present invention is the ability to support a variety of I/O solutions on any given CMC board without changing the CMC board's basic mechanical structure. This is achieved through the use of replaceable daughter I/O cards, which connect to the CMC board.

With reference to FIGS. 1–3, the shaded area 100 represents the maximum "footprint" of the daughter I/O card 20 within CMC board 10. Given the CMC I/O envelope of 74 mm width×31 mm depth, and accommodating the bezel, it has been found that 65 mm×31 mm is a suitable, maximum "footprint" for daughter I/O board 20.

FIG. 2 shows a suitable layout of what is sometimes called the "component side" of daughter I/O card 20. There are mechanical mounting holes 201,202 and 203 (for mechanical alignment and attachment with CMC board 10), multi-pin connector 205 (for electrical connection with CMC board 10). and I/O connectors 206 (for connection to an external device, e.g. another board which does analog to digital conversions). When mounted to CMC board 10, the component side of daughter card 20, as seen in FIG. 2, faces the component side of the CMC board.

FIG. 3 shows the opposed surface of FIG. 2, and is sometimes called the "solder" side although components can be also mounted thereon.

CMC board 10 has a socket for receiving daughter I/O card 20. The socket has some pin locations allocated to be connected to a bus structure on CMC board 10, and some pin locations allocated to be connected to the interconnect structure. Daughter I/O card 20 can be designed so that the pins correctly line up with the allocated pin locations on the socket of CMC board 10. In this manner, CMC board 10 need not be changed when a different I/O solution is desired.

A daughter I/O card 20 can contain signal-level translation chips, such as LVDS transceiver chip. The LVDS daughter I/O card 20 can be 64.5 mm wide and 31 mm deep covering almost the entire I/O envelope of CMC board 10. To fully use the gap between CMC board 10 and daughter I/O card 20, the stacking heights can be 7.0 mm. This will allow tall components (e.g. tantalum capacitors or I/O connectors), to be placed on the bottom or component side of the daughter I/O card 20. The top or solder side of the daughter I/O card 20 can accommodate low profile components (e.g. bypass capacitors or chips).

Three mounting holes are provided as follows. A pair is provided with each placed 18.5 mm from the bottom edge and 3.0 mm from the side edge of daughter I/O card 20. This pair of mounting holes mates with the mounting holes on CMC board 10 as described in the CMC standard. There is a third mounting hole placed 14.0 mm from the bottom edge and 30.1 mm from each of the aforementioned pair of mounting holes. This particular configuration of mounting holes is designed to provide enough support so that the daughter I/O card 20 does not warp while installed on CMC board 10. All mounting holes are 2.7 mm in diameter. Each mounting hole has a copper pad that is 5.7 mm in diameter and connected to chassis ground.

There is 140-pin connector 205 located at the bottom edge of the daughter I/O card 20. This connector is designed to mate with a matching socket on CMC board 10. The LVDS daughter I/O card 20 can be set up so that the pins of the signal-level translation chip connect to the signal pins of CMC board 10 socket, and in that way signals can be transmitted between devices on CMC board 10 and other card that support LVDS signaling.

The LVDS daughter I/O card 20 is divided into three sections: a transmitter section, a receiver section, and a synchronization section.

A National Semiconductor DS90CR484 LVDS receiver chip is used on the daughter I/O card 20 to receive inbound LVDS signals and perform clock recovery. The receiver LVDS interface consists of a recovered data clock, a secondary data clock, a 48-bit data bus, a de-skew control signal, a cable present detection signal, and filtered power signals.

A National Semiconductor DS90CR483 transmitter chip is used on the LVDS daughter I/O card 20 to transmit outbound LVDS signals. The transmitter LVDS interface consists of a transmit data clock, a secondary data clock, a 48-bit data bus, a de-skew control signal, a power-down control signal, and filtered power signals.

A 26-pin Honda connector RMCA-EA26JLMY-OM22-A is used for each of the LVDS front panel interface on the daughter I/O card 20. Each signal is routed on a 100-Ohm differential wire pair. The connectors are labeled LVDS IN and LVDS OUT.

National Semiconductor SN65LVDM176 LVDS transceiver chips are used on the daughter I/O card 20 to implement a synchronization bus, which consists of 5 general-purpose data bits, a synchronization control signal, a data valid control signal, and a synchronization master/slave control signal.

The synchronization connector is a 10-pin SAMTEC TMS-105-01-S-D-RA locking ribbon cable connector on the front panel LVDS daughter I/O card 20. The connector is labeled SYNC.

It is understood that the above is an exemplary embodiment only. Depending on the requirements, different configurations of pins, components and the like can be designed as a function of, e.g., the desired number of I/O signals, Vcc, ground signals, etc. For example, for I/O demands less than the example described above, a smaller, 100 pin connector might suffice, which in turn frees up more space for other components.

With reference to FIG. 4, where

H=standoff and stacking height, being the separation between CMC board 10 and daughter card 20

H1=component height of daughter card 20 on what is sometimes called the "component side"

H2=component height of daughter card 20 on what is sometimes called the "solder" side.

H3=Maximum height of any one component or combination and

C1=component height of components on CMC board 10, it has been found that the following dimensions are a suitable starting template for design.

TABLE 1

I/O Daughter Card Component Height

| Standoff & Stacking Height (H) FIG. 4 | Side 1 Component Height (H1) FIG. 4 | Side 2 Component Height (H2) FIG. 4 | Side 1 Special Component Height (H3) FIG. 4 | CMC Top Side Component Height (C1) FIG. 4 | CMC Top Side Special Component Height |
|---|---|---|---|---|---|
| 5 mm | 2.5 mm | 2.9 mm | 4.50 mm | 2.0 mm | 0.0 mm |
| 6 mm | 3.0 mm | 1.9 mm | 5.50 mm | 2.5 mm | 0.0 mm |
| 7 mm | 3.5 mm | 0.9 mm | 6.50 mm | 3.0 mm | 0.0 mm |
| 8 mm | 4.0 mm | 0.0 mm | 7.50 mm | 3.5 mm | 0.0 mm |

For the above, it has been assumed that the PCB board portions of the daughter card and CMC board 10 have nominal heights of 1.6 mm. Obviously, anything more than the nominal height of 1.6 mm of CMC board 10's PCB portion, will reduce the maximum H2. Also, the above table is for a CMC board 10 with a stacking height of 10 mm (corresponding to a 9.5 mm maximum height of the I/O envelope). It is understood that for the designer, any combination of components is possible as long as there is a (desired) 0.5 mm clearance between components or between component and PCB board (to allow for air flow and the like).

While the preferred embodiment has described a daughter I/O card 20 (a card contemplated to perform only I/O functions for CMC board 10), this invention also contemplates that the daughter card can be used to perform core functions (as part of or as a supplement to the core functions performed by CMC board 10) or to perform both I/O and core functions. Basically, the present invention contemplates increasing the "real estate" of CMC board 10, for performing both I/O and core functions, by adding one or more modular daughter cards that fit within the CMC I/O envelope.

While the preferred embodiment has described a daughter I/O card 20 with I/O connectors 206, other arrangements with such connectors are possible. For example, CMC board 10 may have such I/O connectors 206 instead of what is shown in FIG. 2, or both daughter I/O card 20 and CMC board 10 may have such I/O connectors 206 (neither examples are illustrated).

The preferred embodiment has been described with reference to the I/O and component envelopes of the CMC standards of IEEE Standard P1386. In particular, the description has been made with reference to CMC stacking height of 10 mm. It is understood by those in the art that the CMC standard sets out options for other stacking heights (such as 8 mm, 9 mm and 11 mm) and that this invention and the preferred embodiment would need only a simple adjustment to conform to those other stacking options. More generally, it is understood by those in the art that this IEEE standard is subject to ongoing discussions for amendment and that while it is not anticipated that the I/O envelope dimensions will change, it will be readily apparent to those in the art that this invention may be easily adjusted accordingly to fit any newly amended I/O envelope. It would be a matter of simple design to take advantage of more space (if the amended dimensions were larger) or to downgrade certain I/O functionality (if the amended dimensions cramped then existing configurations) or to use components, connectors and the like that were smaller, etc. Also, it will be readily understood by those in the art that this invention may be easily adjusted to fit standards other than the CMC standard.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A configurable computer board system attachable to a host computer bus of a host computer, comprising:

(a) a computer beard having core functions and I/O functions, and electrical connections with the host computer bus;

(b) a daughter card with desired characteristics, having electrical connections with said computer board and being electrically connectable to another device of the host computer;

wherein the core functions and I/O functions of said computer board are configurable according to said desired characteristics of said daughter card;

wherein the form factor of said computer board with said connected daughter card, conforms to the Common Mezzanine Card standard;

wherein said daughter card, when connected to said computer board, fits within the I/O envelope defined in said standard; and wherein said computer board and said daughter card and components thereof are configured substantially in accordance with one row of the following table:

| Standoff & Stacking Height (H) | Side 1 Component Height (H1) | Side 2 Component Height (H2) | Side 1 Special Component Height (H3) | Top Side Component Height (C1) | Top Side Special Component Height |
|---|---|---|---|---|---|
| 5 mm | 2.5 mm | 2.9 mm | 4.50 mm | 2.0 mm | 0.0 mm |
| 6 mm | 3.0 mm | 1.9 mm | 5.50 mm | 2.5 mm | 0.0 mm |
| 7 mm | 3.5 mm | 0.9 mm | 6.50 mm | 3.0 mm | 0.0 mm |
| 8 mm | 4.0 mm | 0.0 mm | 7.50 mm | 3.5 mm | 0.0 mm | where H is the standoff and stacking height, being the separation between computer board and daughter card, H1 is the component height of daughter card, H2 is the component height of the daughter card, H3 is the maximum height of any one component or combination of components and C1 is the component height of components on said computer board.

2. A configurable computer board system attachable to a host computer bus of a host computer, comprising:
- (a) a computer board having core functions and I/O functions, and electrical connections with the host computer bus and being electrically connectable to another device of the host computer;
- (b) a daughter card with desired characteristics, having electrical connections with said computer board;

wherein the core functions and I/O functions of said computer board are configurable according to the characteristics of said daughter card;

wherein said daughter card has means to perform one or both of I/O functions and core functions for said computer board;

wherein the form factor of said computer board with said daughter card, conforms to the Common Mezzanine Card standard in respect of the I/O envelope defined in said standard, and wherein said computer board and said daughter card and components thereof are configured substantially in accordance with one row of the following table:

| Standoff & Stacking Height (H) | Side 1 Component Height (H1) | Side 2 Component Height (H2) | Side 1 Special Component Height (H3) | Top Side Component Height (C1) | Top Side Special Component Height |
|---|---|---|---|---|---|
| 5 mm | 2.5 mm | 2.9 mm | 4.50 mm | 2.0 mm | 0.0 mm |
| 6 mm | 3.0 mm | 1.9 mm | 5.50 mm | 2.5 mm | 0.0 mm |
| 7 mm | 3.5 mm | 0.9 mm | 6.50 mm | 3.0 mm | 0.0 mm |
| 8 mm | 4.0 mm | 0.0 mm | 7.50 mm | 3.5 mm | 0.0 mm | where H is the standoff and stacking height, being the separation between computer board and daughter card, H1 is the component height of daughter card, H2 is the component height of the daughter card, H3 is the maximum height of any one component or combination of components and C1 is the component height of components on said computer board.

* * * * *